United States Patent [19]

Wald

[11] Patent Number: 5,049,966

[45] Date of Patent: Sep. 17, 1991

[54] LATERAL TRANSISTOR BETA REDUCTION BY INCORPORATION OF ELECTRICALLY ACTIVE MATERIAL

[75] Inventor: P. Gregory Wald, Boise, Id.

[73] Assignee: Micron Technology, Inc., Boise, Id.

[21] Appl. No.: 613,410

[22] Filed: Nov. 15, 1990

[51] Int. Cl.$^5$ .............................................. H01L 27/02
[52] U.S. Cl. ........................................ 357/42; 357/64; 357/40; 357/41
[58] Field of Search .................... 357/64, 91, 42, 41, 357/40

[56] References Cited

U.S. PATENT DOCUMENTS

| | | | |
|---|---|---|---|
| 4,291,329 | 9/1981 | Hanes et al. | 357/64 |
| 4,684,413 | 8/1987 | Goodman et al. | 357/91 X |
| 4,754,315 | 6/1988 | Fisher et al. | 357/64 |
| 4,920,396 | 4/1990 | Shinohara et al. | 357/42 |

Primary Examiner—William Mintel
Assistant Examiner—Roy Potter
Attorney, Agent, or Firm—Wells, St. John & Roberts

[57] ABSTRACT

An electronic semiconductor apparatus having enhanced resistance to detrimental minority carrier substrate injection comprises:

a semiconductor substrate of a first conductivity type material having a first predetermined dopant density, the material having conduction and valence energy state band edges which are separated by an energy band gap;

an active area of a second conductivity type formed within the substrate, the active area in operation being a source of injection of minority carriers into the substrate; and an implant region formed beneath the active area to promote recombination of minority carriers with majority carriers within the first conductivity type substrate material in a region of the substrate local to the implant region, the implant region comprising discrete clusters of an implant material which is electrically complimentary to accept minority carriers emanating from the active area, the implant material having an electrically active energy band which is substantially within the energy band gap of the semiconductor substrate material.

3 Claims, 7 Drawing Sheets

LATERAL TRANSISTOR BETA REDUCTION BY INCORPORATION OF ELECTRICALLY ACTIVE MATERIAL

TECHNICAL FIELD

This invention relates generally to problems associated with minority carrier substrate injection in integrated electronic semiconductor circuits.

BACKGROUND OF THE INVENTION

Semiconductor materials are typically made from atoms that share electrons with each other to exactly fill the "s" and "p" shells of each atom. The outer shells of such atoms may be occupied by as many as eight electrons. In silicon and germanium, each atom has four electrons in its outer shell. However, adjacent atoms share electrons so that each outer shell is occupied by eight electrons. Gallium arsenide (GaAs), another semiconductor, comprises gallium, having three outer shell electrons, and arsenide, having five outer shell electrons. The two types of atoms in GaAs share electrons to fill each outer shell with eight electrons.

In intrinsic or undoped semiconductors, the outer shell is filled and the material is actually insulating rather than semiconductive since no free carriers are available in the outer shell. However, there is always a lack or excess of electrons in real-world materials. An excess of electrons starts filling the next available shell, while a lack of electrons will leave a shell with vacancies. When a shell is not completely filled, the electrons are not tightly bound to the atom and can move from or to the non-filled shell, thus making the material conductive.

As atoms are brought together to form a semiconductive material, the electrons of each atom are acted on in such a way that the Pauli exclusion principle is obeyed, i.e., no two electrons in the material are allowed to have the same energy. This principle requires the existence of bands of allowed energies for electrons, with the bands typically separated by disallowed energy bands. The outermost band, which has the potential to be filled with electrons, is terminated by the valence band edge $E_v$, and is separated from the next allowed energy by a disallowed energy band. The next allowed energy band, the conduction band, starts at the conduction band edge, $E_c$. In ideal semiconductor materials (no impurities) electrons do not have energies between $E_v$ and $E_c$, the disallowed energy band. The range of disallowed energies between $E_c$ and $E_v$ is termed the energy band gap, $E_g$. FIG. 8 shows G(E), the density of allowed states as a function of energy for a semiconductor material.

In an n-type semiconductor, an excess of electrons exists, with the excess electrons having an energy at or above the conduction band edge $E_c$. In p-type semiconductor material, electron vacancies exist, creating vacant energy states at or below the valence band edge $E_v$. Electron vacancies are referred to as holes and can be thought of as having energies similar to electrons. Electron excesses or vacancies can be controlled quite precisely by doping to obtain the desired characteristics of a material.

The concept of discrete electrical "carriers" is commonly used in conceptualizing electric conduction in semiconductor materials. A carrier may be either an electron or a hole. Since holes are more abundant in p-type material than are electrons, holes are termed "majority carriers" in p-type material. Electrons in p-type material are termed "minority carriers." In n-type material, the situation is reversed—electrons are majority carriers and holes are minority carriers.

Statistical analysis is helpful in predicting and understanding the behavior of carriers in semiconductors. In particular, Fermi-Dirac statistics predict the distribution of electron energies and hole energies within n-type and p-type semiconductors. FIG. 5 illustrates the Fermi-Dirac distribution function, $f_D(E)$, for an undoped semiconductor material and gives the statistical probability of an electron having a particular energy E. The "Fermi Energy," $E_F$, is that energy at which $f_D(E)$ equals one-half. The corresponding distribution function for holes is exactly the opposite that for electrons, or $1 - f_D(E)$.

$E_F$ is approximately midway between $E_c$ and $E_v$ in an intrinsic semiconductor (FIG. 5). $E_F$ changes as an intrinsic semiconductor is doped. In n-type semiconductors, $E_F$ is closer to the conductive band edge $E_c$ (FIG. 6). In p-type semiconductors, $E_F$ becomes closer to the valence band edge $E_v$ (FIG. 7).

Integrating the product of G(E) (FIG. 8) and $f_D(E)$ over energy E for p-type material (FIG. 7) yields a function n(E) of occupied states as shown in FIG. 9 for electrons in p-type material, and a function p(E) of occupied states as shown in FIG. 10 for holes in p-type material. A similar exercise may be performed for n-type material.

Based upon the probability function $f_D(E)$ and the Fermi level $E_F$ for an undoped semiconductor material (FIG. 5), it can be observed that virtually all energy states in the valence band will be occupied by electrons, and virtually all energy states in the conduction band will be occupied by holes. As the Fermi level $E_F$ increases (FIG. 6, n-type), the probability is higher that energy states within the conduction band will be occupied by electrons. As the Fermi level decreases (FIG. 7, p-type), the probability is higher that energy states within the valence band will be occupied by holes. In general, most allowable states above the Fermi level will be occupied by holes, and most allowable states below the Fermi level will be occupied by electrons.

In many semiconductor devices, circumstances arise wherein minority carriers are injected into specific regions of a semiconductor. For instance, electrons having energies in the conduction band are often injected into p-type regions. As can be seen in FIG. 7, the probability of an electron having such an energy is very low in p-type material, and the electron will often "recombine" with a hole in the conduction band—the electron will fall to a lower energy state to fill the hole. However, recombination occurs over time—while many electrons recombine quickly, others can travel a significant distance within the p-type material before recombining. Thus, at any time, a small but significant number of injected minority carriers are likely to be present in the p-type material.

CMOS integrated circuits are particularly sensitive to the injection and continued presence of minority carriers in the substrate material. Minority carrier injection into the bulk substrate tends to induce latchup or to discharge dynamic storage nodes in dynamic memory circuits.

Latchup is a well-known phenomenon in CMOS circuits, and significant effort is expended during the design of CMOS structures to eliminate latchup. A pair of undesirable parasitic bipolar transistors, inherent in the basic CMOS structure, facilitates latchup. If one of the parasitic transistors becomes forward biased, an internal feedback path will permanently latch both parasitic transistors in the forward-biased condition—usually creating a short between a voltage supply and ground. The latchup condition can be eliminated only by removing power from the circuit.

The tendency of a CMOS structure to behave in this way depends upon the gain of the parasitic transistors, with higher transistor gain making latchup more likely. The gain of CMOS parasitic bipolar transistors is, in turn, determined by the number of minority carriers present within the circuit's bulk substrate. A greater number of injected minority carriers increases parasitic transistor gain and, therefore, increases the likelihood of latchup.

Dynamic storage nodes may also be affected by injected minority carriers. DRAM charged storage capacitors in CMOS are accessed by n-channel MOS field effect transistors. However, an n+ region of such a transistor, positively charged by a storage capacitor, will tend to attract substrate minority carriers (electrons) from the underlying p-type material. These electrons, when accepted by the n+ region and capacitor, can discharge the capacitor to an unacceptable level, effectively removing a positive charge from the storage capacitor. Such a result is obviously harmful to the proper operation of a DRAM circuit.

Minority carriers, as mentioned above, naturally tend to recombine with majority carriers present in the substrate. However, in typical CMOS circuits, a significant number of minority carriers avoid recombination, often leading to latchup or discharging of dynamic storage nodes as described above. Prior attempts to reduce the number of minority carriers have been directed toward attacting such carriers to appropriately charged "guard rings."

FIGS. 1 and 2 illustrate prior art CMOS structures utilizing guard rings to attract and draw away minority carriers. Both figures illustrate similar structures, and features common to both figures are designated with identical reference numerals.

FIG. 1 illustrates a portion of a typical CMOS structure 10 including one p-channel MOS field effect transistor 12 and two n-channel MOS field effect transistors 14 and 16. Guard rings 20 and 22 separate the transistors. Separating areas 21 of field oxide are located between guard rings and transistors.

Each transistor has two active source and drain areas, with p-channel devices having p+ active areas and the n-channel devices having n+ active areas. Active areas of a transistor are diffused into a substrate well of complementary semiconductor material and spaced such that the complementary semiconductor material separates the two active areas. It is of course possible to use the bulk substrate as the well for transistors of complementary material to the bulk substrate. In this document, "substrate" by itself refers to either a substrate well or the bulk substrate. The channel area between each active area pair is covered by a thin layer of oxide over which a conductively doped polysilicon electrode, the gate, is applied. The active areas of transistors 10, 12, and 14 are designated with the suffix "a" and the gate of each transistor is designated with the suffix "b". The substrate well material into which the active areas are diffused is designated with the suffix "c". A bulk substrate 23 of p− material underlies the substrate wells. Accordingly, the substrate is comprised of a bulk substrate and substrate wells.

Guard rings 20 and 22 are diffused in the substrate well material between adjacent transistors. Each guard ring comprises an n+ area, designated with the suffix "a"; a p+ area, designated with the suffix "b"; and a separating area of field oxide, designated with the suffix "c". Each n+ area 20a and 22a is connected to $V_{cc}$, typically the highest voltage supplied to the chip. Each p+ area 20b and 22b is connected to $V_{ss}$, typically the lowest voltage used within the chip.

When a positive voltage (with respect to the voltage of the substrate) is applied to the gate of an n-channel transistor such as transistor 14, electrons in p-well 14c are attracted toward gate 14b and accumulate in the channel. This accumulation of electrons creates an inversion layer beneath gate 14b—the p-type substrate well material of the channel is electrically and temporarily changed to n-type material. A conduction path for majority carriers (electrons) is thus created between active areas 14a through the now n-type channel.

In the FIG. 1 illustration, electrons are majority carriers in n+ active areas 14a and 16a of n-channel transistors 14 and 16. However, conditions do arise whereby some electron carriers are injected into the underlying substrate wells 14c and 16c and bulk substrate 23, outside of the channel, where they are classified as minority carriers. Such injected electrons seek to achieve a lower energy state by recombining with complimentary holes in the p material.

However, minority carrier lifetime (time to recombine) within the substrate is long enough that circuit techniques are used to collect minority carriers. Guard rings 20 and 22 are fabricated between transistors to attract and draw away those electrons which avoid recombination. The paths of injected minority carrier electrons are illustrated by dashed lines 24, 25, and 26 in FIG. 1. Guard rings 20 and 22 have positively charged n+ areas 20a and 22a which tend to attract minority carrier electrons from the substrate. For example, an electron whose path is illustrated by dashed line 24 is attracted to n+ guard ring area 20a, and an electron whose path is illustrated by dashed line 25 is attracted to n+ guard ring area 22a. Other electrons, such as those following path 26, impinge on and are collected by n+ active areas of adjacent transistors, in this case active area 16a, when those active areas are at a positive voltage. If the positive voltage is created by a positive charge at a dynamic storage node, such a positive charge will eventually be depleted, resulting in loss of the data stored at the dynamic storage node.

A modified construction intended to increase the likelihood of minority carriers being received by guard rings is illustrated in FIG. 2. Here, an implant layer 28 is provided beneath but adjacent the source/drain active areas of the transistors. Implant layer 28 is comprised of silicon dioxide which acts as a barrier. The barrier causes electrons to reflect back into the local substrate well area from which they were originally injected and eventually into adjacent rings.

Prior attempts to reduce the number of minority carriers in a semiconductor have principally focused on directing those minority carriers toward collection areas such as guard rings. This invention, however, focuses on reducing the number and effects of detrimental minority carrier substrate injection by promoting recombination of minority carriers near the source of injection rather than collection of minority carriers at a guard ring.

BRIEF DESCRIPTION OF THE DRAWINGS

Preferred embodiments of the invention are described with reference to the accompanying drawings, in which.

DETAILED DESCRIPTION OF THE PREFERRED EMBODIMENTS

The following disclosure of the invention is submitted in furtherance with the constitutional purpose of the Patent Laws "to promote the progress of science and useful arts" (Article 1, Section 8).

Figure 1:
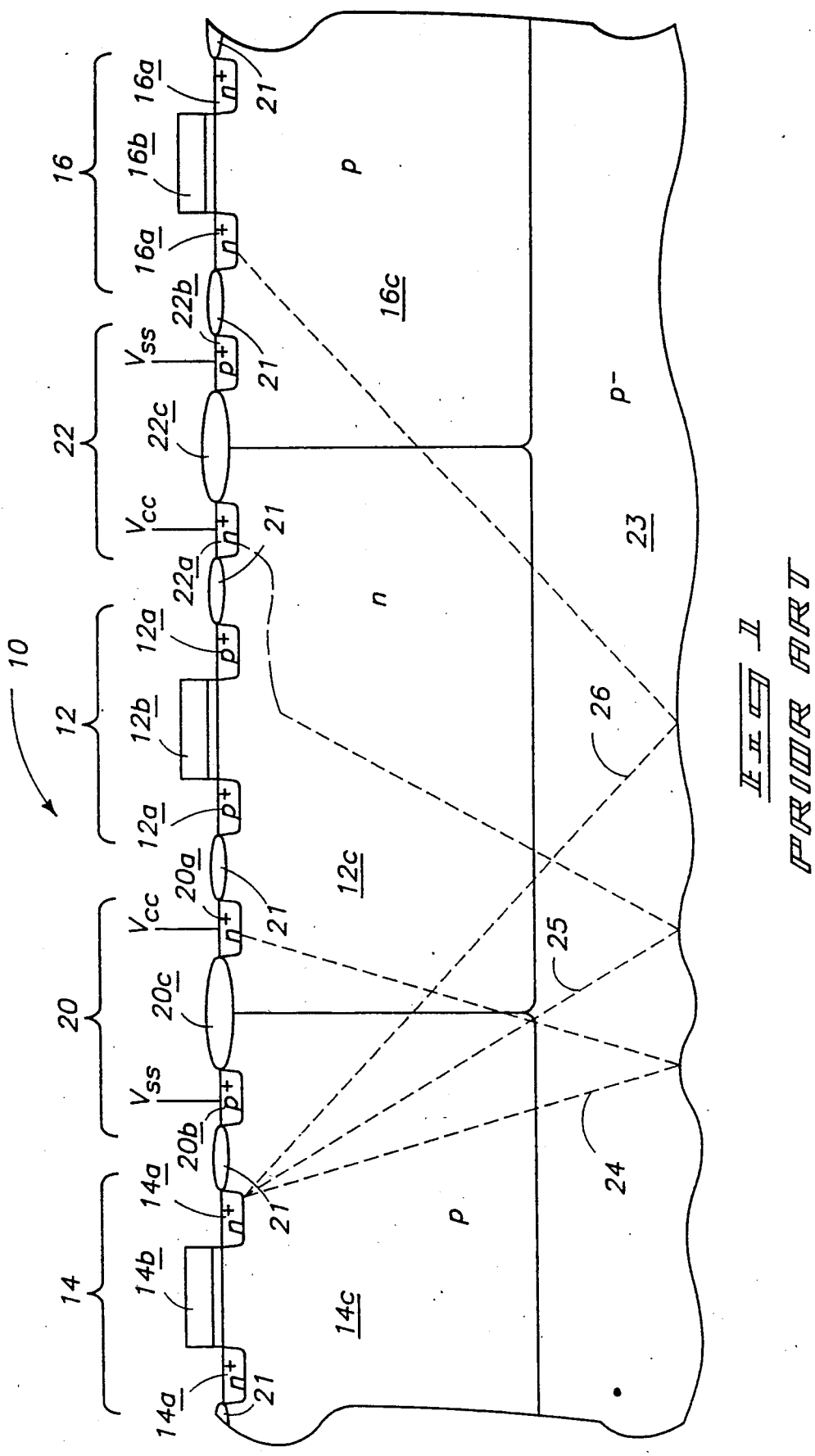
FIG. 1 is a diagrammatic cross section of a prior art semiconductor substrate, and is described in the Background section above.
Figure 2:
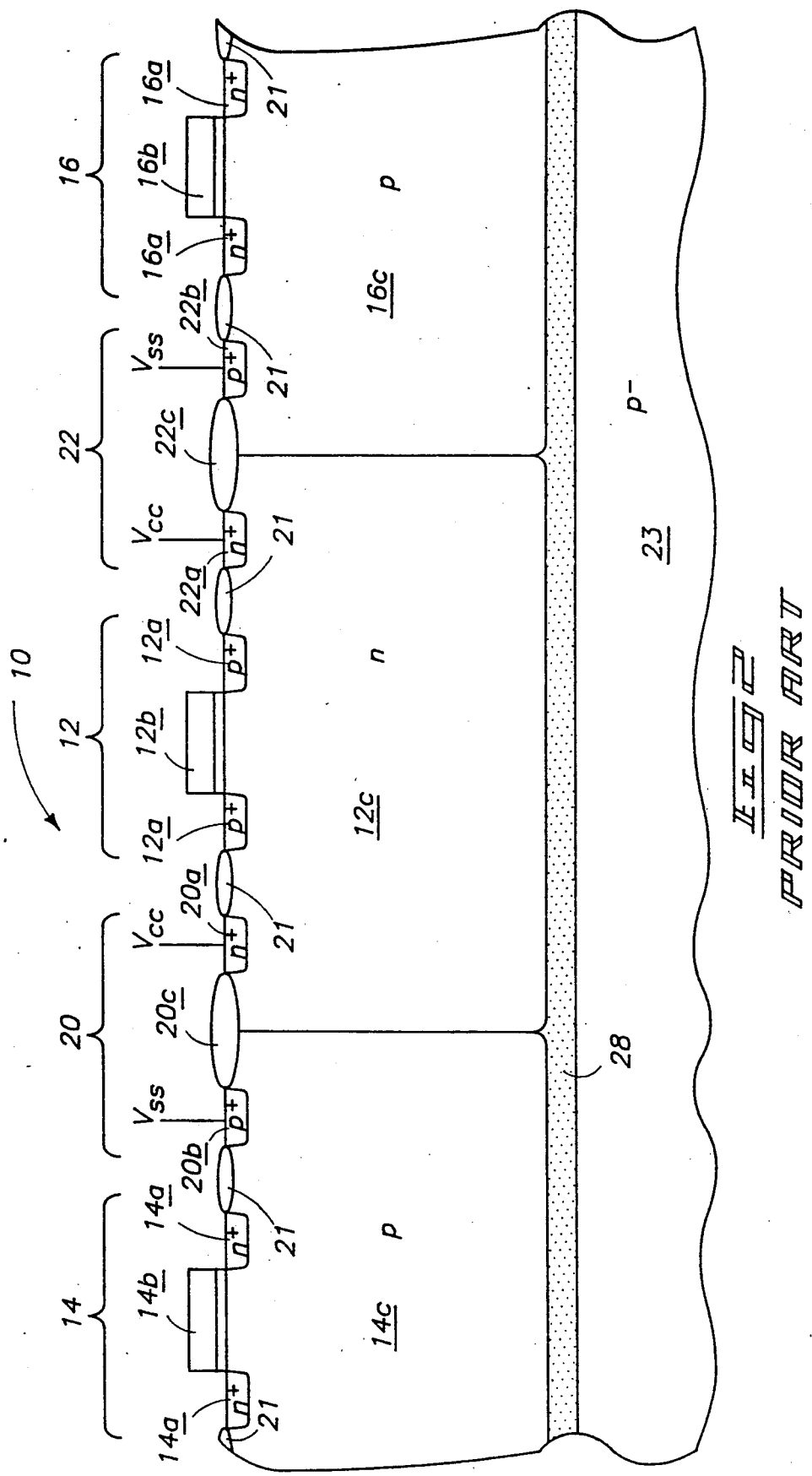
FIG. 2 is a diagrammatic cross section of another prior art semiconductor substrate, and is described in the Background section above.
Figure 3:
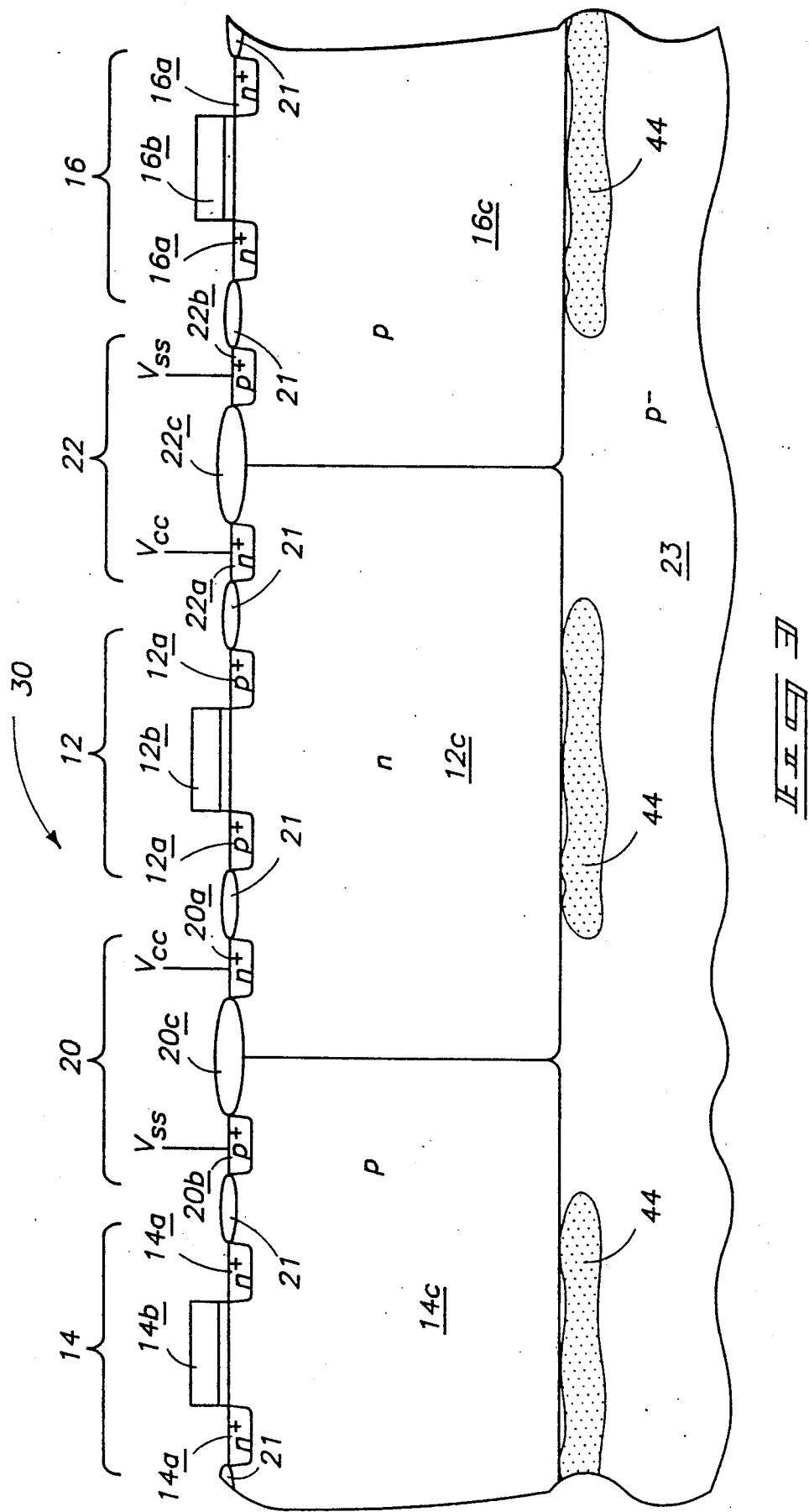
FIG. 3 is a diagrammatic cross section of a semiconductor apparatus in accordance with the invention.

Referring to FIG. 3, the invention comprises in part an electronic semiconductor apparatus 30 having enhanced resistance to detrimental minority carrier substrate injection. For ease of description, the semiconductor apparatus of FIG. 3 is identical to that shown in FIG. 1, but with the addition of implant regions 44 in bulk substrate 23. Although the invention is described with reference to CMOS structures in a p-type bulk substrate, it will be appreciated by the artisan that the same concepts and principles will apply to CMOS structures in an n-type bulk substrate, and to any source of minority carrier injection whether from a p-type region or an n-type region.

As described in the Background section above, active areas 14a and 16a in operation are sources of electrons that are intended to flow from source to drain through an n-type channel created beneath the gate by an electric field. However, these active areas can also be undesirable sources of injection of minority carrier electrons into the substrate.

Implant regions 44 are formed beneath the transistor active areas (i.e., the sources of minority carrier injection). Their function is to promote recombination of injected minority carriers with majority carriers within the substrate material in a region of the substrate local to the active areas.

Figure 7:
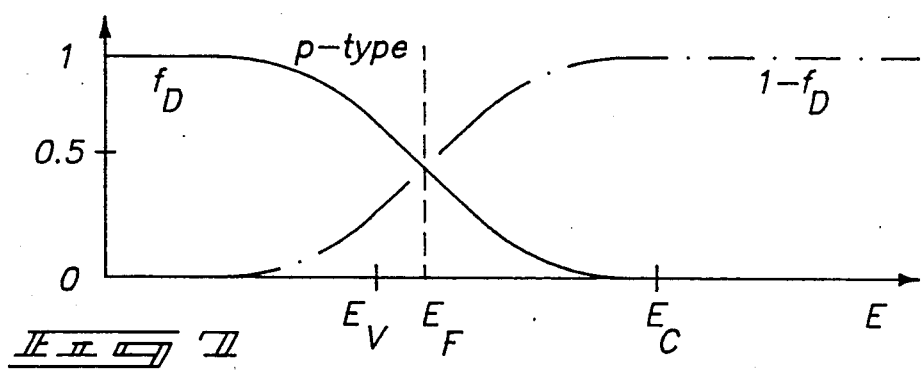
FIG. 7 is a graphical depiction of the theoretical probability, in a p-type semiconductor material, that an allowed state at energy E will be occupied by an electron or a hole.
Figure 8:
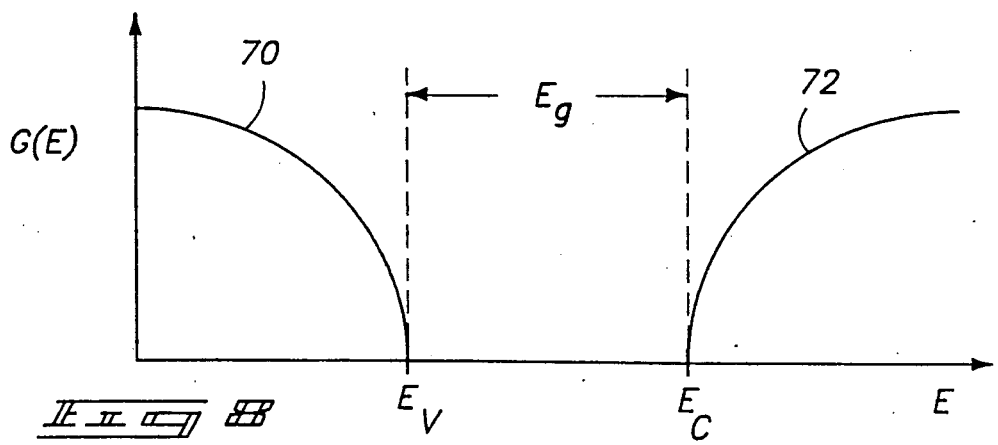
FIG. 8 is a graphical depiction of the distribution of allowed energy states in a semiconductor material.
Figure 9:
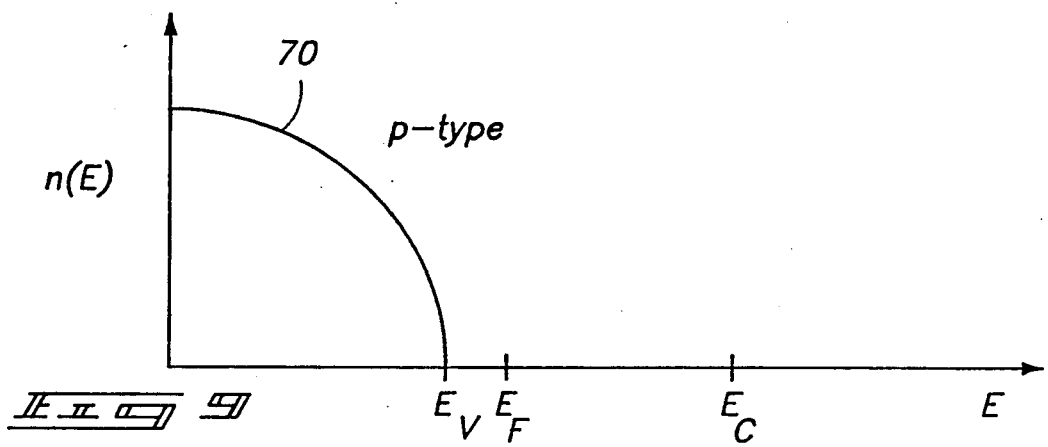
FIG. 9 is a graphical depiction of the energy distribution of electrons in a p-type semiconductor material.
Figure 10:
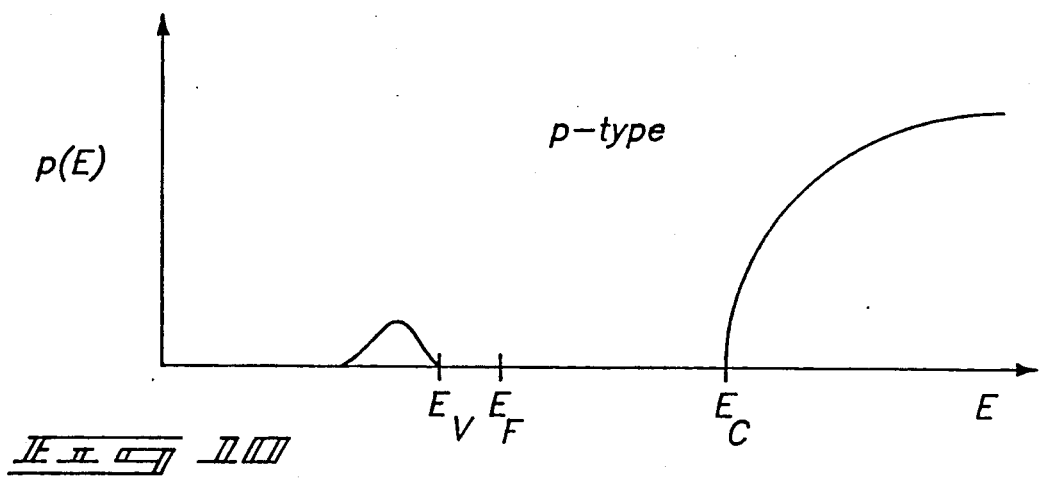
FIG. 10 is a graphical depiction of the energy distribution of holes in a p-type semiconductor material.
Figure 11:
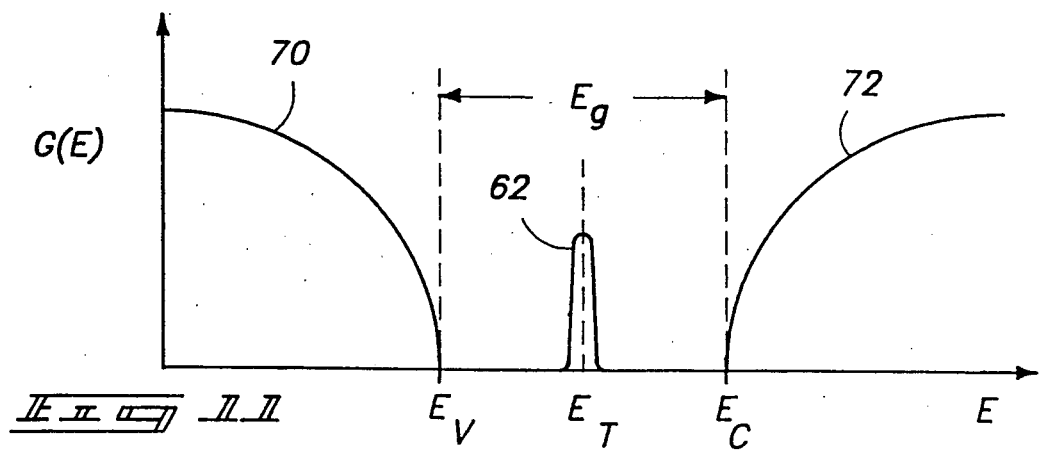
FIG. 11 is a graphical depiction of the distribution of allowed energy states in an implant region of a semiconductor material in accordance with the invention.
Figure 12:
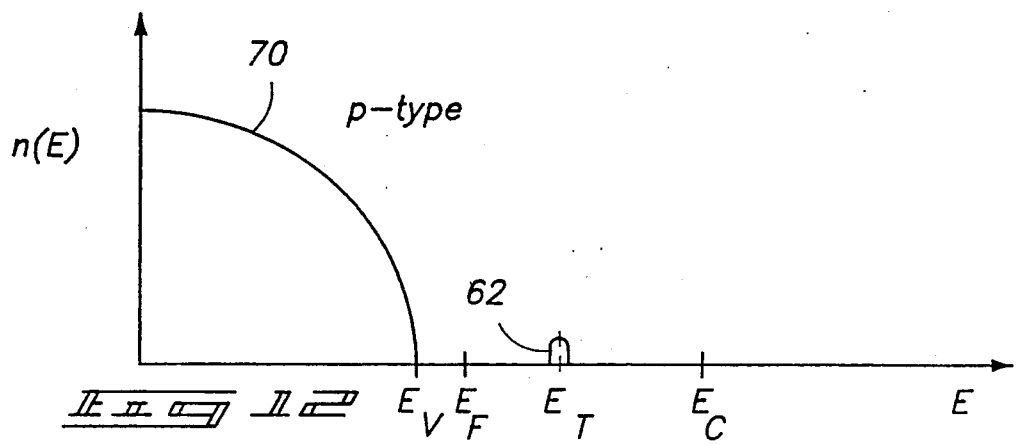
FIG. 12 is a graphical depiction of the energy distribution of electrons in an implant region of p-type semiconductor material in accordance with the invention.
Figure 13:
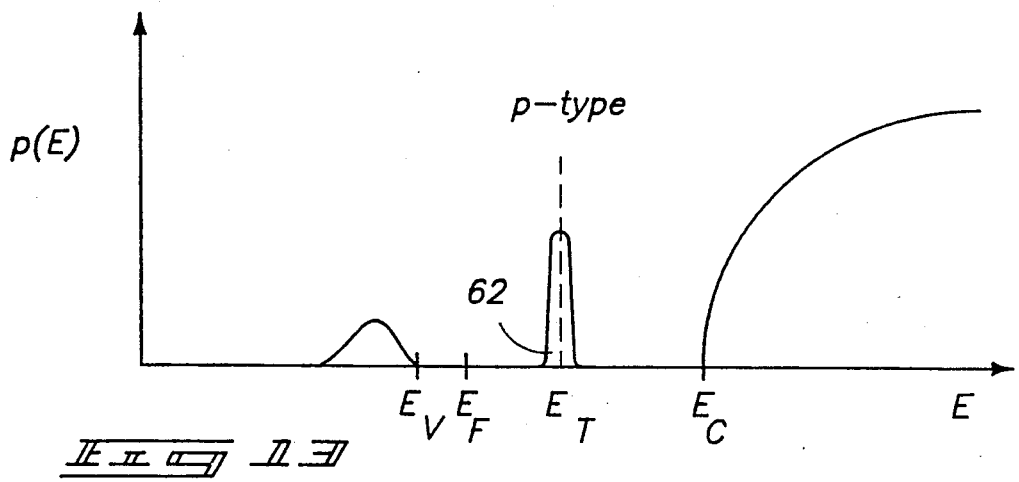
FIG. 13 is a graphical depiction of the energy distribution of holes in an implant region of p-type semiconductor material.

Implant regions 44 are formed to create an allowable energy state or trap energy $E_T$ between $E_v$ and $E_c$. G(E), the density of allowed states, is shown in FIG. 11 for a semiconductor with an allowable energy state at $E_T$, created by an implant region according to this invention. The resulting distribution function n(E) for electrons in p-type material are obtained by integrating G(E) (FIG. 11) and $f_D(E)$ over energy E (FIG. 7). The resulting distribution function p(E) for holes in p-type material are obtained by integrating G(E) (FIG. 11) and $1-f_D(E)$ over energy E (FIG. 7). These functions are shown in FIGS. 12 and 13, respectively. While energy state $E_T$ would not normally be allowed, the diffusion of certain materials, such as oxygen, within a p-type substrate will form localized areas of defects with a trap energy band 62 of $E_T$ to promote the above described recombination.

$E_T$ is preferably midway between $E_v$ and $E_c$ so that $E_T$ is higher than the Fermi level $E_F$ in p-type semiconductor material. The Fermi-Dirac distribution $f_D(E)$ for p-type material (FIG. 7) would predict that an energy state midway between $E_v$ and $E_c$ and above $E_F$ would be primarily occupied by holes. An injected minority electron carrier within p-type material, with an energy at or above $E_c$ and seeking a lower energy state, will tend to recombine with a hole. It will, however, be more likely to recombine with a hole at a now allowable or available energy state $E_T$ than with a hole at or below $E_v$, since the energy transition required to enter the energy state at $E_T$ is less than that required to enter the valence energy band. Further, once at energy $E_T$, the electron, still seeking a lower energy state, will combine with a hole in the p-type material by further reducing its energy from $E_T$ to $E_v$. The electron will thus be replaced by a hole at energy $E_T$. Accordingly, an allowable energy state around $E_T$ tends to promote recombination by allowing an electron to reduce its energy through two discrete transitions which are smaller than the single transition from $E_c$ to $E_v$ which would otherwise be required. When $E_T$ is midway between $E_v$ and $E_c$, each of these discrete energy transitions is approximately half of the full energy transition which would be required of an electron in falling from $E_c$ to $E_v$.

In n-type material, an energy state $E_T$ will be primarily occupied by electrons. Injected hole carriers within n-type material will seek to recombine with electrons and will be drawn towards the electrons at $E_T$. Thus, recombination is also promoted in n-type material when an energy state is provided between $E_v$ and $E_c$.

Implant regions 44 are, therefore, preferably comprised of an implant material which is complimentary to accept minority carriers emanating from an active area. In one sense, the electrically active material can be considered as an impurity which promotes the recombination of minority carriers with majority carriers. The implant material has an electrically active energy band 62 which is substantially within the energy band gap of the semiconductor substrate material. Ideally, the implant material has an electrically active energy band which has its peak substantially midway between the conductive band and the valence band of the semiconductor substrate material within the energy band gap, as shown in FIG. 11. Presence of an implant material having these characteristics has the effect of increasing the probability of recombination.

More particularly, where the conductivity type of the semiconductor substrate is p and the conductivity type of the active area is n, the electrically active material of the implant region is an electron acceptor material. Where the conductivity type of the semiconductor substrate is n and the conductivity type of the active area is p, the electrically active material of the implant region shall be an electron donor material. Clusters of oxygen are a preferred electron acceptor material. A preferred electron donor material has not been determined.

Preferably, discrete clusters of oxygen atoms 46 are disbursed throughout the predominantly silicon material. Oxygen, which is complimentary to accept minority carriers emanating from an active area, produces an allowable energy state in p-type material at an energy which is midway between $E_v$ and $E_c$ and promotes recombination of the minority carriers with majority carriers of the substrate material. For example, oxygen as an electron acceptor will latch onto an electron (the minority carrier in the illustrated p-type substrate) eventually causing it to recombine with adjacent holes in the p- bulk substrate material. The energy of a minority carrier ($E_c$) in such instance, at room temperature, is approximately $E_v + 1.12$ eV at room temperature. The energy of an electron covalently bound within a silicon lattice ($E_v$), at room temperature, is approximately $E_c - 1.12$ eV. Implanted oxygen has an electrically active energy band having a peak which is approximately midway between $E_c$ and $E_v$. The energy band gap $E_g$ is approximately equal to 1.12 eV.

The electrically active implant material is preferably slow diffusing (has a slow diffusivity constant) within the substrate. Use of oxygen as an implant material tends to produce clusters of oxygen atoms. To implant oxygen, and to create oxygen clusters, a predetermined amount of oxygen atoms would be ion implanted at a location within the substrate that will be generally beneath active areas 12, 14, and 16. The oxygen clusters might also be fabricated to extend partially beneath guard rings 20 and 22. The predetermined amount of implanted oxygen should be substantially below the amount of oxygen that could be injected to produce a $SiO_2$ molecular barrier. At the writing of this document, the invention has not yet been reduced to practice.

Next, the substrate would be heated to a predetermined temperature for a predetermined amount of time taking into consideration other processing steps. For oxygen, precipitates or clusters of oxygen should be formed in some volume, such as generally defined by the boundary 44 in FIG. 3. Low volume implantation of slow diffusing oxygen will cause localized clustering to occur. Materials with higher diffusivity constants might also be usable in accordance with the invention but would be much less preferred. The greater the diffusion of the electrically active material within the substrate upon heating, the more scattering will occur and the more likely the recombination clusters would be dis-placed away from the necessary region for optimal performance.

The preferred method and construction will place the recombination centers in a desired area of the substrate which is local to the active areas without being so close as to degrade device performance. This could be within or beneath the substrate wells. Most preferably, the implant region will be formed to have a peak density which is at a location within the bulk substrate beneath the substrate wells to place the implant region immediately beneath the substrate wells, as shown. This will prevent significant leakage of minority carriers through the substrate wells and into the bulk substrate. For example, where active areas (regions) have depths of approximately 0.4 microns and substrate well depths are approximately 4.0 microns, the preferred peak implant material density would be formed at approximately 6.0 to 7.0 microns.

Figure 4:
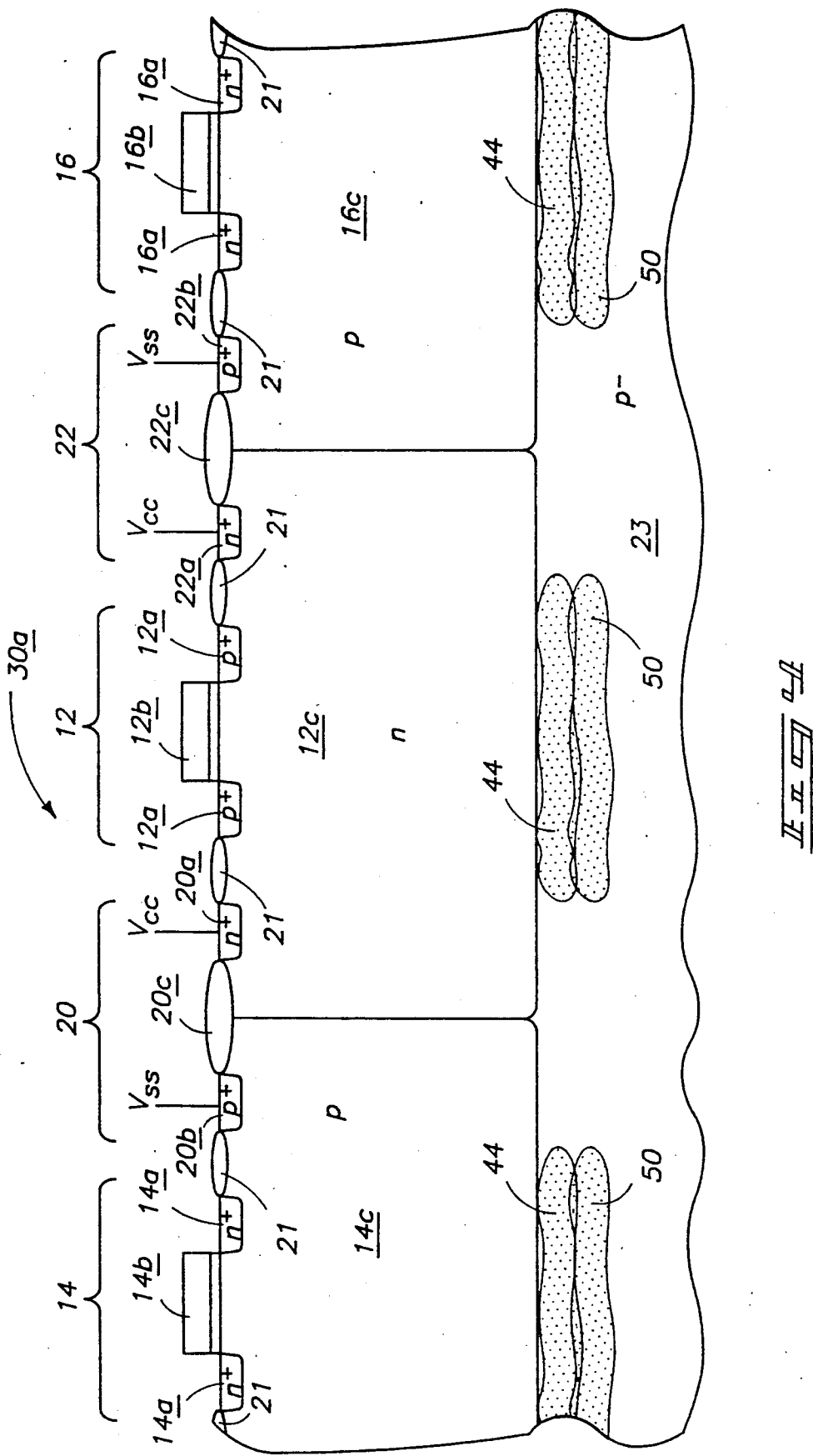
FIG. 4 is a diagrammatic cross section of an alternate embodiment semiconductor apparatus in accordance with the invention.
Figure 5:
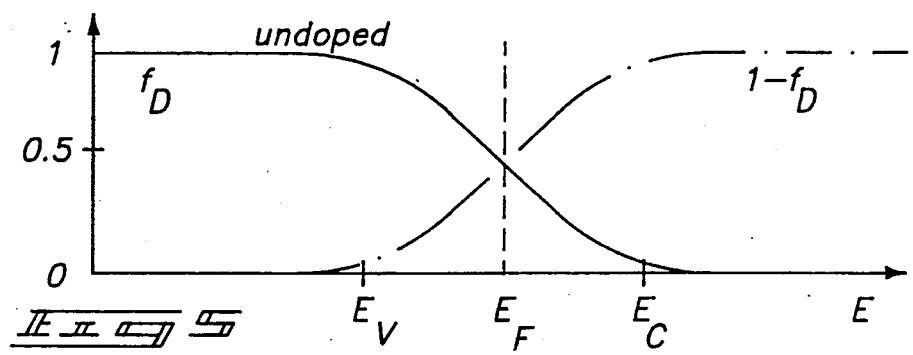
FIG. 5 is a graphical depiction of the theoretical probability, in an undoped semiconductor material, that an allowed state at energy E will be occupied by an electron or a hole.
Figure 6:
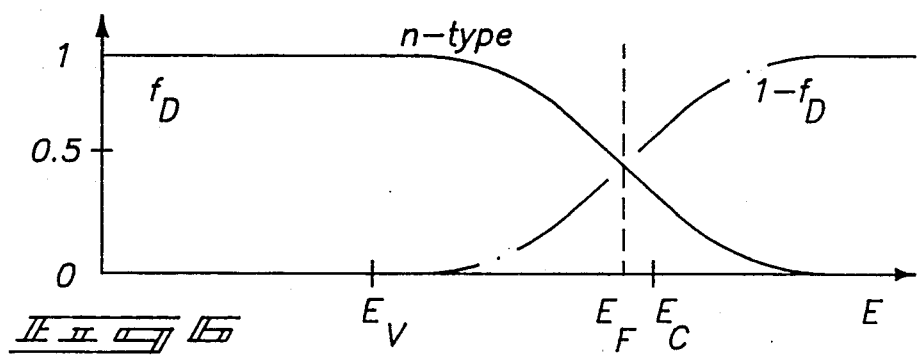
FIG. 6 is a graphical depiction of the theoretical probability, in n-type semiconductor material, that an allowed state at energy E will be occupied by an electron or a hole.

FIG. 4 illustrates an alternate embodiment apparatus 30a in accordance with the invention. Here, minority carrier deflecting regions 50, such as p+ material, are formed to be positioned beneath electrically active implant regions 44. Regions 50 function by reflecting minority carriers which make it through regions 44 back into regions 44 to increase the probability of interaction and recombination with the majority carriers of the implant material. Minority carrier regions 50 are preferably of the first conductivity type and, in the illustrated embodiment, would be of the p material. The bulk substrate p-material would be of a first predetermined dopant density, with the predetermined dopant density of the minority carrier deflecting region being of a higher density for causing the deflection.

Minority carrier deflecting regions 50 would have a dopant peak density which is formed within the substrate at a location beneath electrically active implant regions 44. In the embodiment illustrated in FIG. 4, a portion of each minority carrier deflecting region 50 underlies as well as overlaps with each electrically active implant region 44. Regions 44 and 50 may be configured to abut or extend beneath the guard rings.

In compliance with the statute, the invention has been described in language more or less specific as to structural and methodical features. It is to be understood, however, that the invention is not limited to the specific features shown, since the means and construction described comprise preferred forms of putting the invention into effect. The invention is, therefore, claimed in any of its forms or modifications within the proper scope of the appended claims appropriately interpreted in accordance with the doctrine of equivalents.

I claim:

1. An electronic semiconductor apparatus having enhanced resistance to detrimental minority carrier substrate injection, the apparatus comprising:

a semiconductor substrate of a first conductivity type material having a first predetermined dopant density, the material having conduction and valence energy state band edges which are separated by an energy band gap;

an active area of a second conductivity type formed within the substrate, the active area in operation being a source of injection of minority carriers into the substrate;

an implant region formed beneath the active area to promote recombination of minority carriers with majority carriers within the first conductivity type substrate material in a region of the substrate local to the implant region, the implant region comprising discrete clusters of an implant material which is electrically complimentary to accept minority carriers emanating from the active area, the implant material having an allowable electrically active energy which is substantially within the energy band gap of the semiconductor substrate material; and a minority carrier deflecting region formed within the substrate and positioned beneath the implant region, the allowable electrically active energy of the implant material being within the energy band gap substantially midway between the conduction band edge and the valence band edge of the semiconductor substrate material, the minority carrier deflecting region being of the first conductivity type and having a second predetermined dopant density which is greater than the first predetermined dopant density, the minority carrier deflecting region having a dopant peak density which is formed within the substrate at a location beneath the implant region.

2. An electronic semiconductor apparatus having enhanced resistance to detrimental minority carrier substrate injection, the apparatus comprising:

a semiconductor substrate of a first conductivity type material having a first predetermined dopant density, the material having conduction and valence energy state band edges which are separated by an energy band gap;

an active area of a second conductivity type formed within the substrate, the active area in operation being a source of injection of minority carriers into the substrate;

an implant region formed beneath the active area to promote recombination of minority carriers with majority carriers within the first conductivity type substrate material in a region of the substrate local to the implant region, the implant region comprising discrete clusters of an implant material which is electrically complimentary to accept minority carriers emanating from the active area, the implant material having an allowable electrically active energy which is substantially within the energy band gap of the semiconductor substrate material; and means positioned beneath the implant region for deflecting minority carriers passing through the implant region back into the implant region to increase probability of interaction and recombination with majority carriers of the implant material.

3. An electronic semiconductor apparatus having enhanced resistance to detrimental minority carrier substrate injection, the semiconductor substrate being of a first conductivity type material having a first predetermined dopant density and having conduction and valence energy state band edges which are separated by an energy band gap, the semiconductor apparatus being produced according to the method comprising the following steps:

implanting a predetermined amount of an implant material at a location within the substrate that will be generally beneath an active area of a second conductivity type, the active area in operation being a source of injection of minority carriers into the substrate;

the implanted material being slow diffusing within the substrate upon heating of the substrate, and being of a material which is electrically complimentary to accept minority carriers emanating from the active area, the implant material having an allowable electrically active energy which is within the energy band gap of the semiconductor substrate material; and creating a minority carrier deflecting region beneath the implant region, the minority carrier deflecting region comprising means for deflecting minority carriers passing through the implant region back into the implant region to increase probability of interaction and recombination with majority carriers of the implant material.

* * * * *